United States Patent
Deng et al.

(10) Patent No.: US 12,283,601 B2
(45) Date of Patent: Apr. 22, 2025

(54) METHOD FOR MANUFACTURING TFT SUBSTRATE AND TFT SUBSTRATE THEREOF

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventors: Yongqi Deng, Huizhou (CN); Li Chai, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/621,941

(22) PCT Filed: Nov. 8, 2021

(86) PCT No.: PCT/CN2021/129362
§ 371 (c)(1),
(2) Date: Dec. 22, 2021

(87) PCT Pub. No.: WO2023/070741
PCT Pub. Date: May 4, 2023

(65) Prior Publication Data
US 2024/0266360 A1   Aug. 8, 2024

(30) Foreign Application Priority Data
Oct. 29, 2021   (CN) .......................... 202111274505.3

(51) Int. Cl.
*H01L 21/00* (2006.01)
*H01L 21/84* (2006.01)
*H01L 27/12* (2006.01)

(52) U.S. Cl.
CPC ...... *H01L 27/1244* (2013.01); *H01L 27/1255* (2013.01); *H01L 27/127* (2013.01); *H01L 27/1288* (2013.01)

(58) Field of Classification Search
CPC ............ H01L 27/1244; H01L 27/1255; H01L 27/127; H01L 27/1288; H01L 29/4908;
(Continued)

(56) References Cited

U.S. PATENT DOCUMENTS

2006/0008932 A1* 1/2006 Oh ........................ G02F 1/1368
438/34
2010/0208153 A1 8/2010 Liu
(Continued)

FOREIGN PATENT DOCUMENTS

CN   104576651 A   4/2015
CN   105932030 A   9/2016
(Continued)

*Primary Examiner* — Ismail A Muse
(74) *Attorney, Agent, or Firm* — Nathan & Associates; Menachem Nathan (57) ABSTRACT

The embodiments of the present application provide a method for manufacturing thin-film transistor (TFT) substrate and a TFT substrate thereof. A semi-finished substrate has a first region, a second region, and a third region. The semiconductor layer and the insulating layer of the semi-finished substrate are patterned under the shielding of the first etching barrier layer and the second etching barrier layer having different thickness, so that only the semiconductor layer in the second region is kept and causing the thickness of the insulating layer in the first region is greater than the thickness of the insulating layer in the third region.

19 Claims, 7 Drawing Sheets

(58) Field of Classification Search
CPC . H01L 29/66742–6678; H01L 29/786–78696;
H01L 27/12–13; H01L 2924/13069;
H01L 29/04–045; H01L 29/16–1608;
H01L 29/18–185; H01L 29/22–2206;
H01L 29/02–365; H01L 29/66439–66469;
H01L 29/66931; H01L 29/7306; H01L
2924/1304–13092; H01L 21/027–0338;
H01L 21/32; H01L 21/312–3128; H01L
21/314–3185; H01L 21/7681; H01L
21/76811; H01L 21/31144; H01L
21/32139; H01L 21/467; H01L 21/475;
H01L 21/469–47576; H10K 10/46–491
See application file for complete search history.

(56) References Cited

U.S. PATENT DOCUMENTS

2012/0261755 A1\* 10/2012 Chen ................ H01L 27/124
257/E21.411
2015/0028340 A1\* 1/2015 Iwasaka ............ H01L 27/124
438/158

FOREIGN PATENT DOCUMENTS

| CN | 111180470 A | 5/2020 |
|---|---|---|
| CN | 111244115 A | 6/2020 |
| WO | 2018094597 A1 | 5/2018 |

\* cited by examiner

METHOD FOR MANUFACTURING TFT SUBSTRATE AND TFT SUBSTRATE THEREOF

FIELD OF INVENTION

The present application relates the field of display field technology, and particularly to a method for manufacturing TFT substrate and a TFT substrate thereof.

BACKGROUND OF INVENTION

With the continuous improvement of display panel technology, the display product changes from 4K to 8K, and the number of wires on the display panel increases significantly. Wires are usually set at a thin-film transistor (TFT) substrate. As the number of wires increases, to ensure the aperture ratio, wiring at different layers is prone to short-circuit or occur crosstalk issue.

Figure 1:
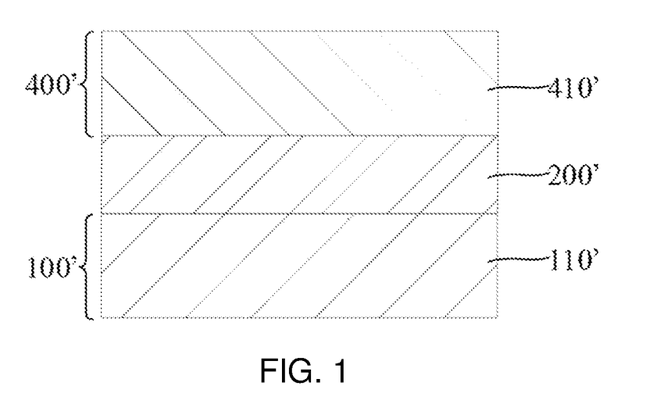
FIG. 1 is a cross-sectional view of the structural schematic diagram of the cross-line region of the first kind of TFT substrate in the related art.

As shown in FIG. 1, which is a structural schematic diagram of the first kind of TFT substrate in the related art. The TFT substrate includes a first metal layer 100', an insulating layer 200' disposed on the first metal layer 100', a semiconductor layer 300' disposed on the insulating layer 200', and a second metal layer 400' disposed on the insulating layer 200' and the semiconductor layer 300', in which the first metal layer 100' includes a first line 110', the second metal layer 400' includes a second line 410', the first line 110' and the second line 410' are disposed corresponding to the cross-line region. Since the insulating layer 200' in the cross-line region is thin, the first line 110' and the second line 410' are easy to short-circuit.

Figure 2:
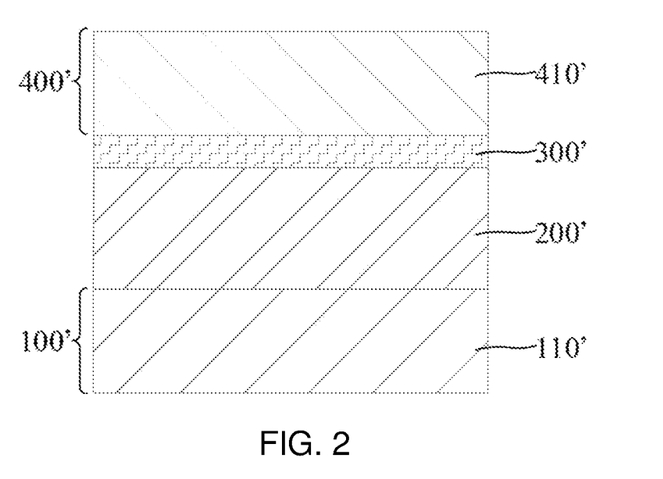
FIG. 2 is a cross-sectional view of the structural schematic diagram of the cross-line region of the second kind of TFT substrate in the related art.

As shown in FIG. 2, which is a structural schematic diagram of the second kind of TFT substrate in the related art. Compared to the TFT substrate in FIG. 1, an insulating layer 200' and a semiconductor layer 300' are disposed in the cross-line region between the first line 110' and the second line 410'. The insulation capacity of the first line 110' and the second line 410' can be enhanced by increasing the spacing between the first line 110' and the second line 410', but this structure can easily lead to crosstalk issue. Specifically, the calculation formula of capacitance is:

$$C = \frac{\varepsilon S}{4\pi k d}$$

Figure 3:
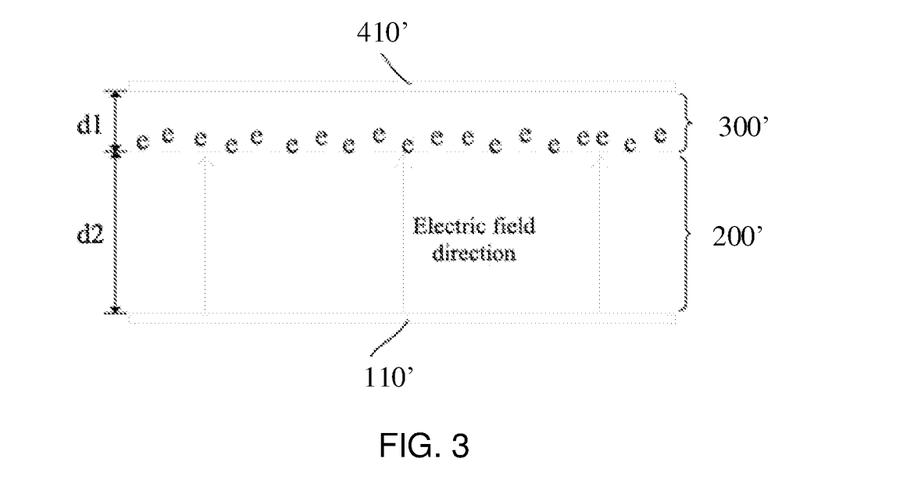
FIG. 3 is a mechanism model diagram of capacitance of the first and second wires at negative half-cycle signal according to the second kind of TFT substrate in the related art.
Figure 4:
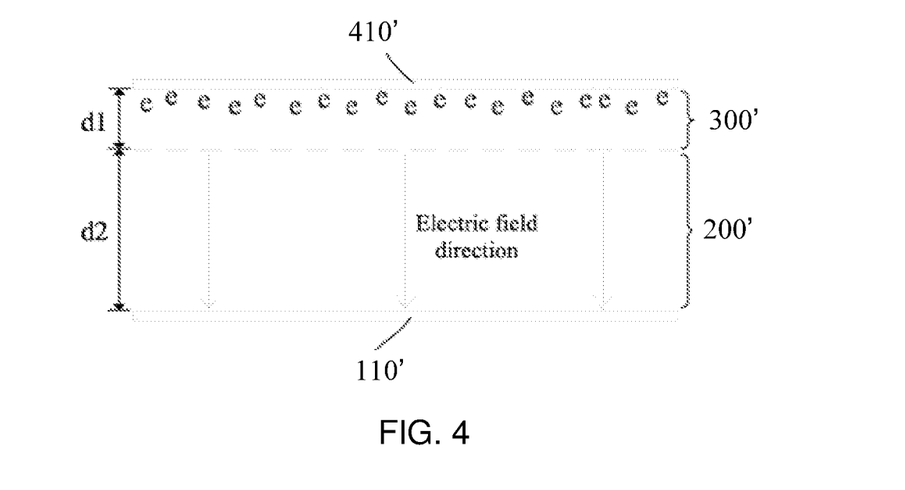
FIG. 4 is a mechanism model diagram of capacitance of the first and second wires at positive half-cycle signal according to the second kind of TFT substrate in the related art.

As shown in FIG. 3, in the case of negative half-cycle signal, the direction of electric field is the direction from the first line 110' toward to the second line 410'. At the meanwhile, the electrons in the semiconductor layer 300' gather towards the first line 110', and the semiconductor layer 300' conducts electricity. The actual distance d between the first line 110' and the second line 410' is d2, and the capacitance C between the first line 110' and the second line 410' is relatively large. As shown in FIG. 4, in the case of positive half-cycle signal, the direction of electric field is the direction from the second line 410' toward the first line 110'. At the meanwhile, the electrons in the semiconductor layer 300' gather towards the second line 410', and the semiconductor layer 300' is insulated. The actual distance d between the first line 110' and the second line 410' is (d1+d2), and the capacitance C between the first line 110' and the second line 410' is relatively small. It can be found that, in such TFT substrate structure, the capacitance between the first line 110' and the second line 410' is different in positive and negative half-cycle signals, resulting in the crosstalk issue of display.

SUMMARY OF INVENTION

Technical Problems

The embodiments of the present application provide a method for manufacturing TFT substrate and a TFT substrate thereof, which resolves the short-circuit issue or the crosstalk issue due to the wiring of the different layers in the TFT substrate.

Technical Solutions

The embodiments of the present application provide a display panel, comprising:
  step B1: forming a photoresist layer on a semi-finished substrate, wherein the semi-finished substrate comprises a first metal layer, an insulating layer disposed on the first metal layer, and a semiconductor layer disposed on the insulating layer, the photoresist layer is disposed on the semiconductor layer, and the semi-finished substrate has a first region, a second region, and a third region;
  step B2: patterning the photoresist layer to expose the semiconductor layer in the third region and form a first etching barrier layer disposed corresponding to the first region and a second etching barrier layer disposed corresponding to the second region, wherein the thickness of the first etching barrier layer is less than the thickness of the second etching barrier layer;
  step B3: etching the semiconductor layer in the third region under the shielding of the first etching barrier layer and the second etching barrier layer;
  step B4: peeling off the first etching barrier layer to expose the semiconductor layer in the first region;
  Step B5: etching the semiconductor layer and the insulating layer under the shielding of the second etching barrier layer to remove the semiconductor layer disposed corresponding to the first region, such that the thickness of the insulating layer in the third region less than the thickness of the insulating layer in the first region.

Optionally, in some embodiments of the present application, the step of patterning the photoresist layer in the step B2 comprises: performing a photolithography process to the photoresist layer under the shielding of a mask.

Optionally, in some embodiments of the present application, the photolithography process is performed by using ultraviolet light in the step B2.

Optionally, in some embodiments of the present application, the exposure volume of the photoresist layer ranges from 35 mJ to 45 mJ.

Optionally, in some embodiments of the present application, the material of the photoresist layer is a positive photoresist, the mask comprises a first pattern region disposed corresponding to the first region, a second pattern region disposed corresponding to the second region, and a third pattern region disposed corresponding to the third region, the transmittance of the first pattern region is greater than the transmittance of the second pattern region, and the transmittance of the first pattern region is less than the transmittance of the third pattern region.

Optionally, in some embodiments of the present application, the transmittance of the first pattern region is 40% to 50%, the transmittance of the second pattern region is 0% to 10%, and the transmittance of the third pattern region is 90% to 100%.

Optionally, in some embodiments of the present application, the material of the photoresist layer is a negative photoresist, the mask comprises a first pattern region disposed corresponding to the first region, a second pattern region disposed corresponding to the second region, and a third pattern region disposed corresponding to the third region, the transmittance of the first pattern region is less than the transmittance of the second pattern region, and the transmittance of the first pattern region is greater than the transmittance of the third pattern region.

Optionally, in some embodiments of the present application, the transmittance of the first pattern region is 50% to 60%, the transmittance of the second pattern region is 90% to 100%, and the transmittance of the third pattern region is 0% to 10%.

Optionally, in some embodiments of the present application, the thickness of the first etching barrier layer is 20% to 35% of the thickness of the second etching barrier layer in the step B2.

Optionally, in some embodiments of the present application, the thickness of the first etching barrier layer obtained in the step B2 is 4000 Å to 6000 Å, and the thickness of the second etching barrier layer obtained in the step B2 is 15000 Å to 20000 Å.

Optionally, in some embodiments of the present application, in the step B3, the semiconductor layer in the third region is etched by dry etching under the shielding of the first etching barrier layer and the second etching barrier layer.

Optionally, in some embodiments of the present application, the semiconductor layer of the third region is partially or completely etched away.

Optionally, in some embodiments of the present application, the step of peeling off the first etching barrier layer to expose the semiconductor layer in the first region in the step B4 comprises: ashing the first etching barrier layer and the second etching barrier layer to remove the first etching barrier layer and reduce the thickness of the second etching barrier layer.

Optionally, in some embodiments of the present application, the semiconductor layer and the insulating layer are etched by dry etching under the shielding of the second etching barrier layer in the step B5.

Optionally, in some embodiments of the present application, the first metal layer comprises a first signal line and a gate electrode, the first signal line is disposed corresponding to the first region, and the gate electrode is disposed corresponding to the second region.

Optionally, in some embodiments of the present application, the method for manufacturing TFT substrate further comprising:
step B6: peeling off the second etching barrier layer to expose the semiconductor layer in the second region.

Optionally, in some embodiments of the present application, the method for manufacturing TFT substrate further comprising:
step B7: forming a second metal layer on the insulating layer and the semiconductor layer.

Optionally, in some embodiments of the present application, in the step B7, the second metal layer comprises a second signal line, a source electrode, and a drain electrode, the second signal line is disposed corresponding to the first region, and the source electrode and the drain electrode are disposed corresponding to the second region.

Optionally, in some embodiments of the present application, the first signal line comprises a scan line extending in a first direction and a storage capacitor line extending in a second direction, the second signal line comprises a data line extending in the second direction, and the first direction and the second direction are set in a present angle.

The embodiments of the present application further provide a TFT substrate, having a first region, a second region, and a third region, and comprising:
a substrate;
a first signal line, disposed on the substrate and corresponding to the first region;
a gate electrode, disposed on the substrate and corresponding to the second region;
an insulating layer, disposed on the substrate, the gate electrode, and the first signal line, and corresponding to the first region, the second region, and the third region;
a semiconductor layer, disposed on the insulating layer and corresponding to the second region;
a source electrode and a drain electrode, disposed on the semiconductor layer and corresponding to the second region; and
a second signal line, disposed on the insulating layer and corresponding to the first region;
wherein the thickness of the insulating layer in the first region is greater than the thickness of the insulating layer in the third region.

Beneficial Effect

The embodiments of the present application provide a method for manufacturing TFT substrate and a TFT substrate thereof. The first etching barrier layer and the second etching barrier layer are formed on the semi-finished substrate, in which the thickness of the first etching barrier layer is less than the thickness of the second etching barrier layer. The semi-finished substrate has the first region, the second region, and the third region. The first etching barrier layer is disposed corresponding to the first region, and the second etching barrier layer is disposed corresponding to the second region. Since the semiconductor layer and the insulating layer of the semi-finished substrate are patterned under the shielding of the first etching barrier layer and the second etching barrier layer, only the semiconductor layer in the second region is kept, so that the thickness of the insulating layer in the first region is greater than the thickness of the insulating layer in the third region. In the present embodiment, the first region may correspond to the cross-line region of the TFT substrate, and the second region may correspond to the TFT region of the TFT substrate. By using the technical solution provided by the present embodiment, it can not only avoid the crosstalk issue caused by increasing the thickness of the insulating layer in the cross-line region when adopting the semiconductor layer, but also increase the thickness of the insulating layer in the cross-line region to prevent the short-circuit issue in the cross-line region.

DESCRIPTION OF DRAWINGS

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

DETAILED DESCRIPTION OF EMBODIMENTS

In order to make technical solutions of the present application being clearly and completely described, the present application is further described in detail below with reference to the accompanying drawings and examples. It should be noted that the specific embodiments described herein are only a portion of embodiments, but not all. Other embodiments obtained, without the creative effort, by person having ordinary skill in the art from the embodiments of the present application belong to the claim scope of the present application. In addition, it should be understood that, in the absence of contrary instructions, positional adjectives such as "above/on" and "beneath/under" refer to the actual use or working state of the device, specifically to the direction of the drawing; "inside" and "outside" refer to the contours of the device.

The embodiments of the present application provide a method for manufacturing TFT substrate and a TFT substrate thereof, as detailed below. It should be noted that the order of description of the following embodiments does not limit the priority order of the embodiments.

Figure 5:
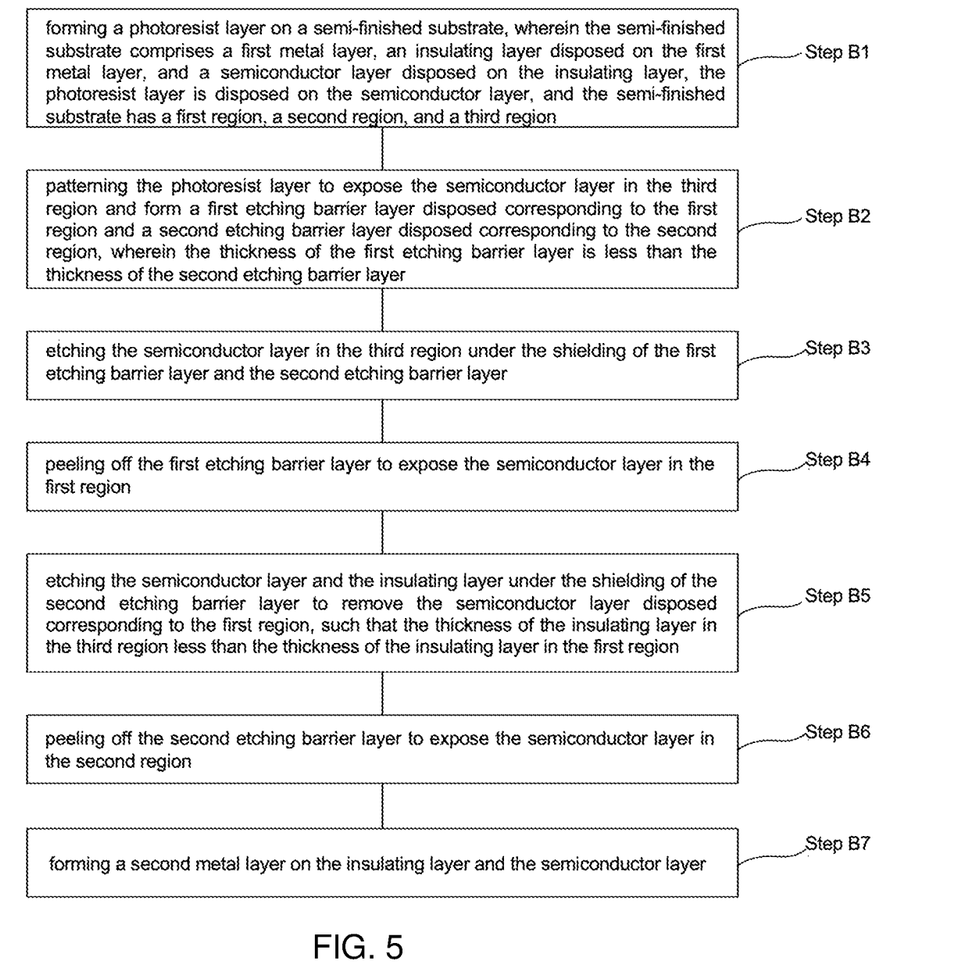
FIG. 5 is a flowchart of a method for manufacturing TFT substrate according to an embodiment of the present application.
Figure 6:
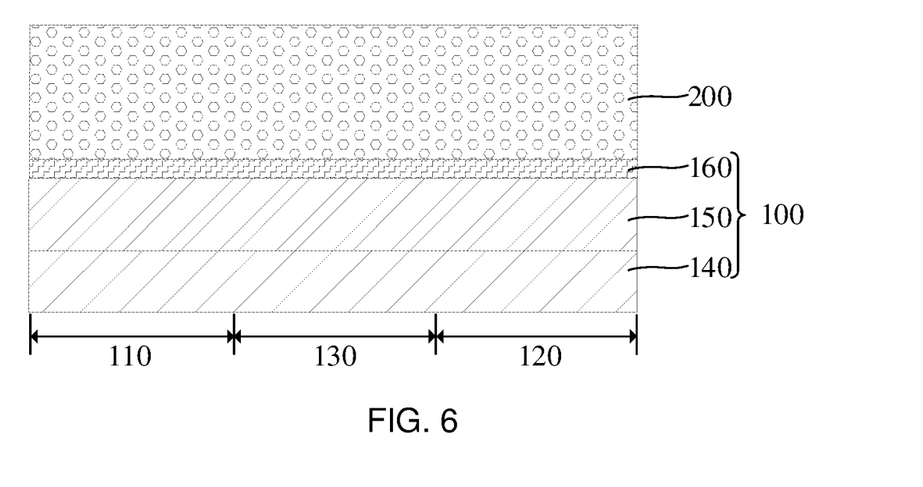
FIG. 6 is a structural schematic diagram of forming a photoresist layer on a semi-finished substrate according to an embodiment of the present application.

Please refer to FIG. 5, the present embodiment provides a method for manufacturing TFT substrate comprising following steps:

Step B1: as shown in FIG. 6, a photoresist layer 200 is formed on a semi-finished substrate 100, wherein the semi-finished substrate 100 comprises a first metal layer 140, an insulating layer 150 disposed on the first metal layer 140, and a semiconductor layer 160 disposed on the insulating layer 150, the photoresist layer 200 is disposed on the semiconductor layer 160, and the semi-finished substrate 100 has a first region 110, a second region 120, and a third region 130.

Figure 7:
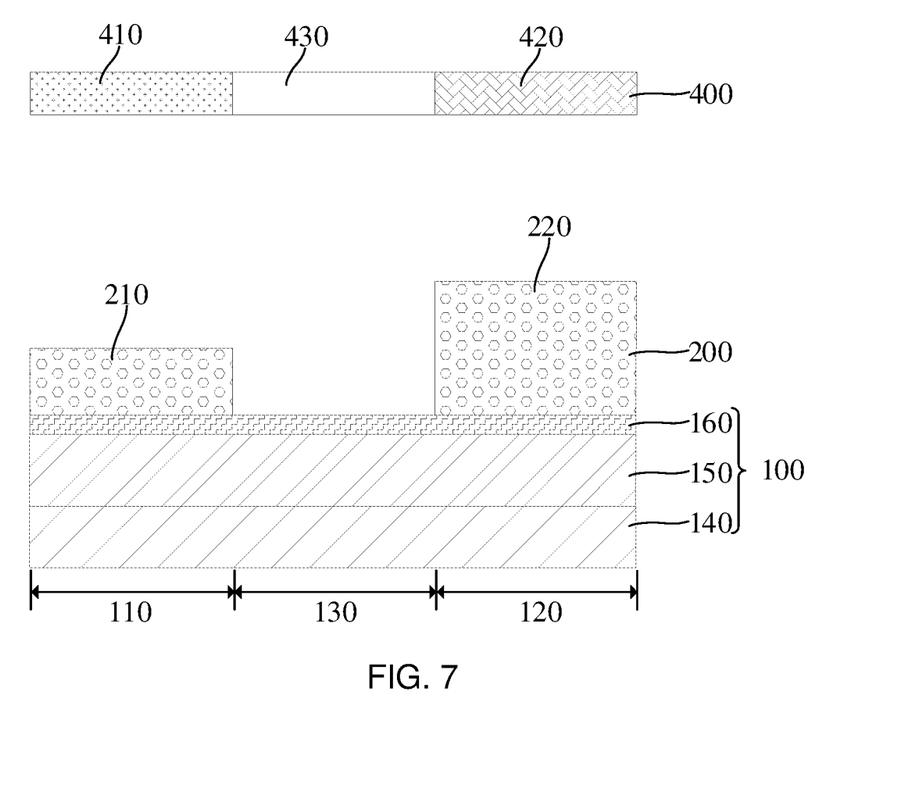
FIG. 7 is a structural schematic diagram of patterning a photoresist layer with a mask according to an embodiment of the present application.

Step B2: as shown in FIG. 6 and FIG. 7, the photoresist layer 200 is patterned to expose the semiconductor layer 160 in the third region 130 and form a first etching barrier layer 210 disposed corresponding to the first region 110 and a second etching barrier layer 220 disposed corresponding to the second region 120. In the step B2, the thickness of the obtained first etching barrier layer 210 is less than the thickness of the second etching barrier layer 220.

Figure 8:
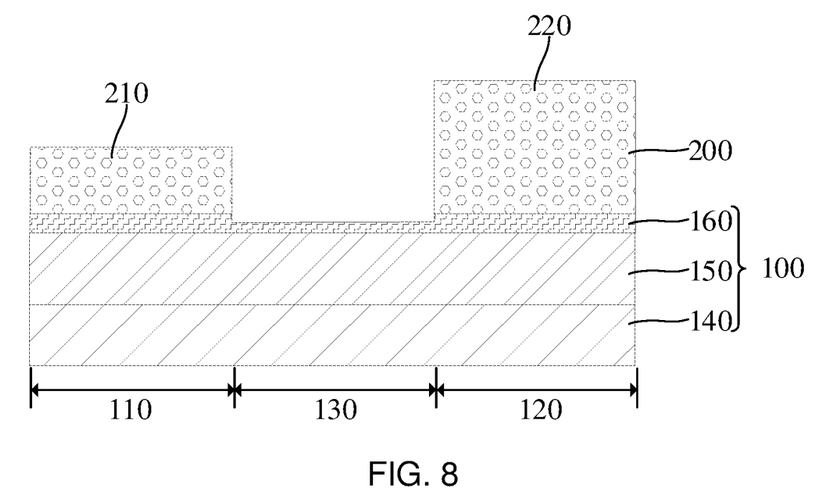
FIG. 8 is a structural schematic diagram of etching a semiconductor layer with a first etching barrier layer and a second etching barrier layer as shielding according to an embodiment of the present application.

Step B3: as shown in FIG. 8, the semiconductor layer 160 in the third region 130 is etched under the shielding of the first etching barrier layer 210 and the second etching barrier layer 220.

Figure 9:
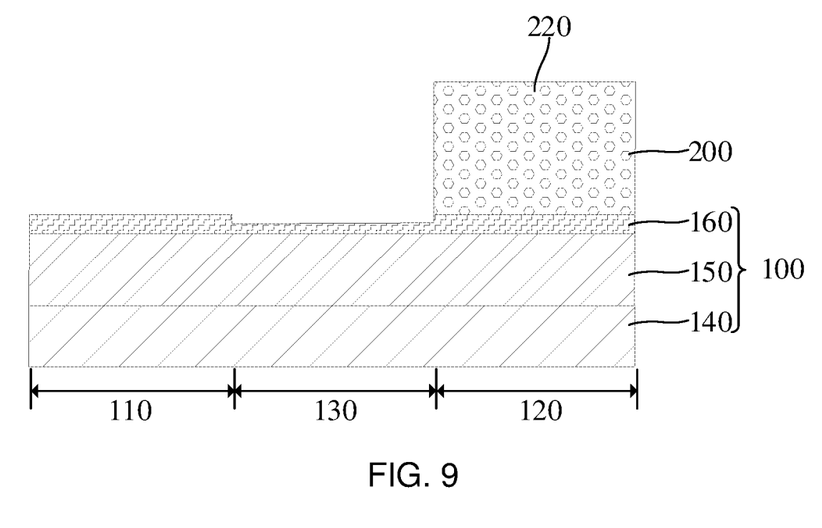
FIG. 9 is a structural schematic diagram of peeling off a first etching barrier layer according to an embodiment of the present application.

Step B4, as shown in FIG. 8 and FIG. 9, the first etching barrier layer 210 is peeled off to expose the semiconductor layer 160 in the first region 110.

Figure 10:
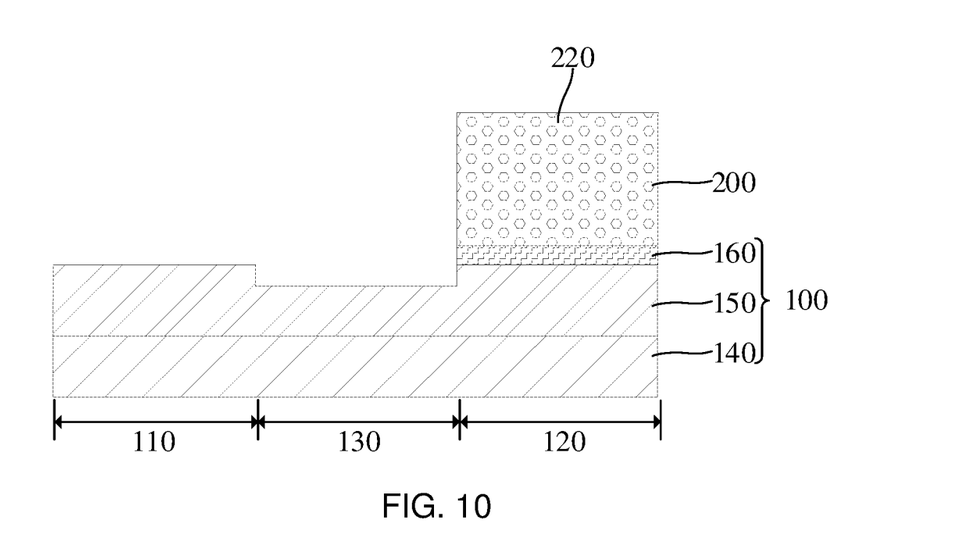
FIG. 10 is a structural schematic diagram of etching a semiconductor layer and an insulating layer with a second etching barrier layer as shielding according to an embodiment of the present application.

Step B5, as shown in FIG. 10, the semiconductor layer 160 and the insulating layer 150 are etched under the shielding of the second etching barrier layer 220 to remove the semiconductor layer 160 disposed corresponding to the first region 110, such that the thickness of the insulating layer 150 in the third region 130 is less than the thickness of the insulating layer 150 in the first region 110.

In the present embodiment, a thinner first etching barrier layer 210 and a thicker second etching barrier layer 220 are formed on the semi-finished substrate 100. Since the semiconductor layer 160 and the insulating layer 150 of the semi-finished substrate are patterned under the shielding of the first etching barrier layer 210 and the second etching barrier layer 220, only the semiconductor layer 160 in the second region 120 is kept, so that the thickness of the insulating layer 150 in the first region 110 is greater than the thickness of the insulating layer 150 in the third region 130.

In the present embodiment, the first region 110 may correspond to the cross-line region of the TFT substrate. The second region 120 may correspond to the TFT region of the TFT substrate. Thus, it can be found that the method for manufacturing TFT substrate according to the embodiments of the present application can fabricate the insulating layer 150, with regular thickness, in the third region 130 and fabricate the thick insulating layer 150 in the cross-line region at the same time. It can not only avoid the crosstalk issue caused by increasing the thickness of the insulating layer 150 in the cross-line region when adopting the semiconductor layer 160, but also increase the thickness of the insulating layer 150 in the cross-line region to prevent the short-circuit issue in the cross-line region.

Specifically, in the aforementioned step B1, the semi-finished substrate 100 may further comprise other structure layers; for example, the semi-finished substrate 100 may further comprise a substrate, which can be, but is not limited to, a glass or polyimide film. In the present embodiment, the first metal layer 140 is disposed on the substrate, the insulating layer 150 is disposed on the first metal layer 140 and the substrate, and the semiconductor layer 160 is disposed on a side, away from the first metal layer 140 and the substrate, of the insulating layer 150. It could be understood that the specific structure of the semi-finished substrate 100 can be modified appropriately according to the choice of actual situation and specific requirements. The invention is not limited thereto.

Specifically, in the aforementioned step B2, the step of patterning the photoresist layer 200 comprises: performing a photolithography process to the photoresist layer 200 under the shielding of a mask 400. In the present embodiment, the first etching barrier layer 210 and the second etching barrier layer 220 having different thickness can be obtained directly through single process of the mask 400, so that the cost of the mask 400 can be saved and the production efficiency can be improved.

Specifically, in the aforementioned step B2, the photolithography process is performed by using ultraviolet. In the present embodiment, the exposure volume of the photoresist layer 200 ranges from 35 mJ to 45 mJ. The mask 400 comprises a first pattern region 410 disposed corresponding to the first region 110, a second pattern region 420 disposed corresponding to the second region 120, and a third pattern region 430 disposed corresponding to the third region 130. By making the transmittance of the first pattern region 410, the second pattern region 420, and the third pattern region 430 different, the exposure volume of the first region 110, the second region 120, and the third region 130 are different, so that the photoresist layer 200 in the third region 130 can be removed and the photoresist layer 200 in the first region 110 and the second region 120 has different thickness.

Optionally, the material of the photoresist layer 200 is a positive photoresist, the transmittance of the first pattern region 410 is greater than that of the second pattern region 420, and the transmittance of the first pattern region 410 is less than that of the third pattern region 430. By such configuration, the photoresist layer 200 in the third region 130 can be removed after the photolithography process, and the thickness of the first etching barrier layer 210 (the photoresist layer 200 in the first region 110) will be less than the thickness of the second etching barrier layer 220 (the photoresist layer 200 in the second region 120).

Specifically, when the material of the photoresist layer 200 is the positive photoresist, the transmittance of the first pattern region 410 can be 40% to 50%, the transmittance of the second pattern region 420 can be 0% to 10%, and the transmittance of the third pattern region 430 can be 90% to 100%. For example, the transmittance of the first pattern region 410 can be 40%, 41%, 42%, 43%, 44%, 45%, 46%, 47%, 48%, 49%, or 50%, the transmittance of the second pattern region 420 can be 0%, 1%, 2%, 3%, 4%, 5%, 6%, 7%, 8%, 9%, or 10%, and the transmittance of the third pattern region 430 can be 90%, 91%, 92%, 93%, 94%, 95%, 96%, 97%, 98%, 99%, or 100%. It could be understood that the transmittance of the first pattern region 410, the second pattern region 420, and the third pattern region 430 can be modified appropriately according to the choice of actual situation and specific requirements. The invention is not limited thereto.

Optionally, the material of the photoresist layer 200 is a negative photoresist, the transmittance of the first pattern region 410 is less than that of the second pattern region 420, and the transmittance of the first pattern region 410 is greater than that of the third pattern region 430. By such configuration, the photoresist layer 200 in the third region 130 can be removed after the photolithography process, and the thickness of the first etching barrier layer 210 (the photoresist layer 200 in the first region 110) will be less than the thickness of the second etching barrier layer 220 (the photoresist layer 200 in the second region 120).

Specifically, when the material of the photoresist layer 200 is the negative photoresist, the transmittance of the first pattern region 410 can be 50% to 60%, the transmittance of the second pattern region 420 can be 90% to 100%, and the transmittance of the third pattern region 430 can be 0% to 10%. For example, the transmittance of the first pattern region 410 can be 50%, 51%, 52%, 53%, 54%, 55%, 56%, 57%, 58%, 59%, or 60%, the transmittance of the second pattern region 420 can be 90%, 91%, 92%, 93%, 94%, 95%, 96%, 97%, 98%, 99%, or 100%, and the transmittance of the third pattern region 430 can be 0%, 1%, 2%, 3%, 4%, 5%, 6%, 7%, 8%, 9%, or 10%. It could be understood that the transmittance of the first pattern region 410, the second pattern region 420, and the third pattern region 430 can be modified appropriately according to the choice of actual situation and specific requirements. The invention is not limited thereto.

Specifically, in the aforementioned step B3, as shown in FIG. 8, the semiconductor layer 160 in the third region 130 can be partially etched away. That is, the thickness of the semiconductor layer 160 in the first region 110 will be greater than the thickness of the semiconductor layer 160 in the third region 130. Of course, the semiconductor layer 16 in the third region 130 can be completely etched away according to the actual situation and specific requirements. The invention is not limited thereto.

Specifically, in the aforementioned step B3, as shown in FIG. 8, the semiconductor layer 160 in the third region 130 is etched by the dry etching process under the shielding of the first etching barrier layer 210 and the second etching barrier layer 220. The dry etching process can be the plasma bombardment, in which the plasma, produced by ionizing reacting gas with an electric field, bombards the semiconductor layer 160 in the third region 130 under the effect of electric field, wherein the electric filed is generated by applying voltage to an electrode pair disposed in a reaction chamber where the reaction gas is injected into.

Optionally, in the aforementioned step B3, the reaction gas injected into the reaction chamber in the etching process of etching the semiconductor 160 in the third region 130 by plasma bombardment can be nitrogen fluoride and helium, in which the flow rate of helium is greater than the flow rate of nitrogen fluoride. The flow rate of nitrogen fluoride is 1500 standard mL/min to 2000 standard mL/min, and that of helium is 1700 standard mL/min to 2300 standard mL/min. For example, the flow rate of nitrogen fluoride can be 1500 standard mL/min, 1600 standard mL/min, 1700 standard mL/min, 1800 standard mL/min, 1900 standard mL/min, or 2000 standard mL/min, and the flow rate of helium can be 1700 standard mL/min, 1800 standard mL/min, 1900 standard mL/min, 2000 standard mL/min, 2100 standard mL/min, 2200 standard mL/min, or 2300 standard mL/min. The semiconductor layer 160 in the third region 130 can be etched by the plasma generated from ionizing nitrogen fluoride and helium with the electric filed.

Optionally, in the aforementioned step B3, the voltage applied to the electrode pair ranges from 3 kV to 13 kV, so that the electric field can be generated, by the electric pair, to ionize the reaction gas and perform plasma bombardment process. The temperature of performing plasma bombardment is 40° C. to 60° C., and the time of performing plasma bombardment is 15 to 20 seconds. For example, the voltage applied to the electric pair can be 3 kV, 4 kV, 6 kV, 8 kV, 10KV, 12 kV, or 13 kV, the temperature of performing plasma bombardment can be 40° C., 45° C., 50° C., 55° C., or 60° C., and the time of performing plasma bombardment can be 15 seconds, 16 seconds, 17 seconds, 18 seconds, 19 seconds, or 20 seconds.

Specifically, in the aforementioned step B4, as shown in FIG. 8 and FIG. 9, the step of peeling off the first etching barrier layer 210 to expose the semiconductor layer 160 in the first region 110 comprises: ashing the first etching barrier layer 210 and the second etching barrier layer 220 to remove the first etching barrier layer 210 and reduce the thickness of the second etching barrier layer 220. In the present embodiment, since the thickness of the second etching barrier layer 220 is greater than that of the first etching barrier layer 210, the second etching barrier layer 220 remains in the second region 120 when the first etching barrier layer 210 is completely removed during the ashing process. In the following step B5, the semiconductor layer 160 and the insulating layer 150 are etched with the remained second etching barrier layer 220 as shielding to remove the semiconductor layer 160 disposed corresponding to the first region 110, so that the thickness of the insulating layer 150 in the third region 130 is less than the thickness of the insulating layer 150 in the first region 110.

Specifically, in the aforementioned step B4, as shown in FIG. 8 and FIG. 9, the ashing process can be performed by plasma bombarding the first etching barrier layer 210 and the second etching barrier layer 220, which the plasma, produced by ionizing reacting gas with an electric field, bombards the first etching barrier layer 210 and the second etching barrier layer 220 under the effect of electric field, wherein the electric filed is generated by applying voltage to an electrode pair disposed in a reaction chamber where the reaction gas is injected into.

Optionally, in the aforementioned step B4, the reaction gas injected into the reaction chamber in the ashing process performed by plasma bombarding the first etching barrier layer 210 and the second etching barrier layer 220 can be nitrogen fluoride and oxygen, in which the flow rate of oxygen is greater than the flow rate of nitrogen fluoride. The flow rate of nitrogen fluoride is 700 standard mL/min to 1000 standard mL/min, and that of oxygen is 12000 standard mL/min to 16000 standard mL/min. For example, the flow rate of nitrogen fluoride can be 700 standard mL/min, 800 standard mL/min, 900 standard mL/min, or 1000 standard mL/min, and the flow rate of oxygen can be 12000 standard mL/min, 13000 standard mL/min, 14000 standard mL/min, 15000 standard mL/min, or 16000 standard mL/min. The bombardment process of the first etching barrier layer 210 and the second etching barrier layer 220 can be done by the plasma generated from ionizing nitrogen fluoride and oxygen with the electric filed.

Optionally, in the aforementioned step B4, the voltage applied to the electrode pair ranges from 4 kV to 24 kV, so that the electric field can be generated, by the electric pair, to ionize the reaction gas and perform plasma bombardment process. The temperature of performing plasma bombardment is 40° C. to 60° C., and the time of performing plasma bombardment is 60 to 100 seconds. For example, the voltage applied to the electric pair can be 4 kV, 6 kV, 8 kV, 10 kV, 12 kV, 13 kV, or 14 kV, the temperature of performing plasma bombardment can be 40° C., 45° C., 50° C., 55° C., or 60° C., and the time of performing plasma bombardment can be 60 seconds, 65 seconds, 70 seconds, 75 seconds, 80 seconds, 85 seconds, 90 seconds, 95 seconds, or 100 seconds.

Specifically, in the aforementioned step B2, the thickness of the first etching barrier layer 210 is less that of the second etching barrier layer 220, so that the second etching barrier layer 220 remains in the second region 120 after the first etching barrier layer 210 is removed by the ashing process in the step B4. In order to ensure the etching shielding performance of the first etching barrier 210 and the first etching barrier layer 210 can be easily peeled off, it is preferable to set the thickness of the first etching barrier layer 210 to be 20% to 35% of the thickness of the second etching barrier layer 220.

Specifically, in the aforementioned step B2, the thickness of the obtained first etching barrier layer 210 is 4000 Å to 6000 Å, and the thickness of the obtained second etching barrier layer 220 is 15000 Å to 20000 Å. For example, the thickness of the first etching barrier layer 210 can be 4000 Å, 4200 Å, 4400 Å, 4600 Å, 4800 Å, 5000 Å, 5200 Å, 5400 Å, 5600 Å, 5800 Å, or 6000 Å, and the thickness of the second etching barrier layer 220 can be 15000 Å, 15500 Å, 16000 Å, 16500 Å, 17000 Å, 17500 Å, 18000 Å, 18500 Å, 19000 Å, 19500 Å, or 20000 Å. It could be understood that the thickness of the first etching barrier layer 210 and the second etching barrier layer 220 can be modified appropriately according to the choice of actual situation and specific requirements. The invention is not limited thereto.

Specifically, in the aforementioned step B5, as shown in FIG. 10, the semiconductor layer 160 and the insulating layer 150 are etched by the dry etching process under the shielding of the second etching barrier layer 220. The dry etching process can be the plasma bombardment, in which the plasma, produced by ionizing reacting gas with an electric field, bombards the semiconductor layer 160 and the insulating layer 150 under the effect of electric field, wherein the electric filed is generated by applying voltage to an electrode pair disposed in a reaction chamber where the reaction gas is injected into.

Optionally, in the aforementioned step B5, the reaction gas injected into the reaction chamber in the etching process of etching the semiconductor 160 and the insulating layer 150 by plasma bombardment can be nitrogen fluoride and helium, in which the flow rate of helium is greater than the flow rate of nitrogen fluoride. The flow rate of nitrogen fluoride is 1500 standard mL/min to 2000 standard mL/min, and that of helium is 1700 standard mL/min to 2300 standard mL/min. For example, the flow rate of nitrogen fluoride can be 1500 standard mL/min, 1600 standard mL/min, 1700 standard mL/min, 1800 standard mL/min, 1900 standard mL/min, or 2000 standard mL/min, and the flow rate of helium can be 1700 standard mL/min, 1800 standard mL/min, 1900 standard mL/min, 2000 standard mL/min, 2100 standard mL/min, 2200 standard mL/min, or 2300 standard mL/min. The semiconductor layer 160 and the insulating layer 150 can be etched by the plasma generated from ionizing nitrogen fluoride and helium with the electric filed.

Optionally, in the aforementioned step B5, the voltage applied to the electrode pair ranges from 3kV to 13kV, so that the electric field can be generated, by the electric pair, to ionize the reaction gas and perform plasma bombardment process. The temperature of performing plasma bombardment is 40° C. to 60° C., and the time of performing plasma bombardment is 50 to 60 seconds. For example, the voltage applied to the electric pair can be 3kV, 4kV, 6kV, 8kV, 10kV, 12kV, or 13kV, the temperature of performing plasma bombardment can be 40° ° C., 45° C., 50° C., 55° C., or 60° C., and the time of performing plasma bombardment can be 50 seconds, 51 seconds, 52 seconds, 53 seconds, 54 seconds, 55 seconds, 56 seconds, 57 seconds, 58 seconds, 59 seconds, or 60 seconds.

Figure 11:
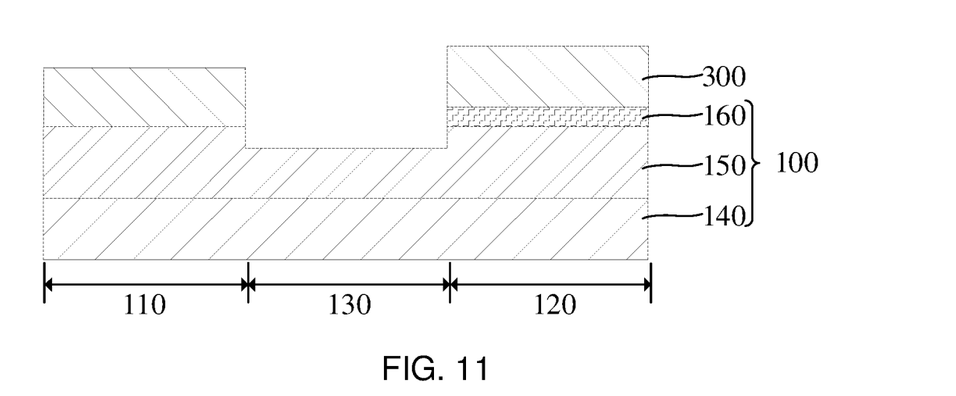
FIG. 11 is a structural schematic diagram of peeling off a second etching barrier layer to form a second metal layer according to an embodiment of the present application.

Specifically, as shown in FIG. 5, FIG. 10, FIG. 11, and FIG. 12, the method for manufacturing TFT substrate further comprises:

step B6: peeling off the second etching barrier layer 220 to expose the semiconductor layer 160 in the second region 120; and step B7: forming a second metal layer 300 on the insulating layer 150 and the semiconductor layer 160. In the present embodiment, the second etching barrier layer 220 can be peeled off by the ashing process.

Figure 12:
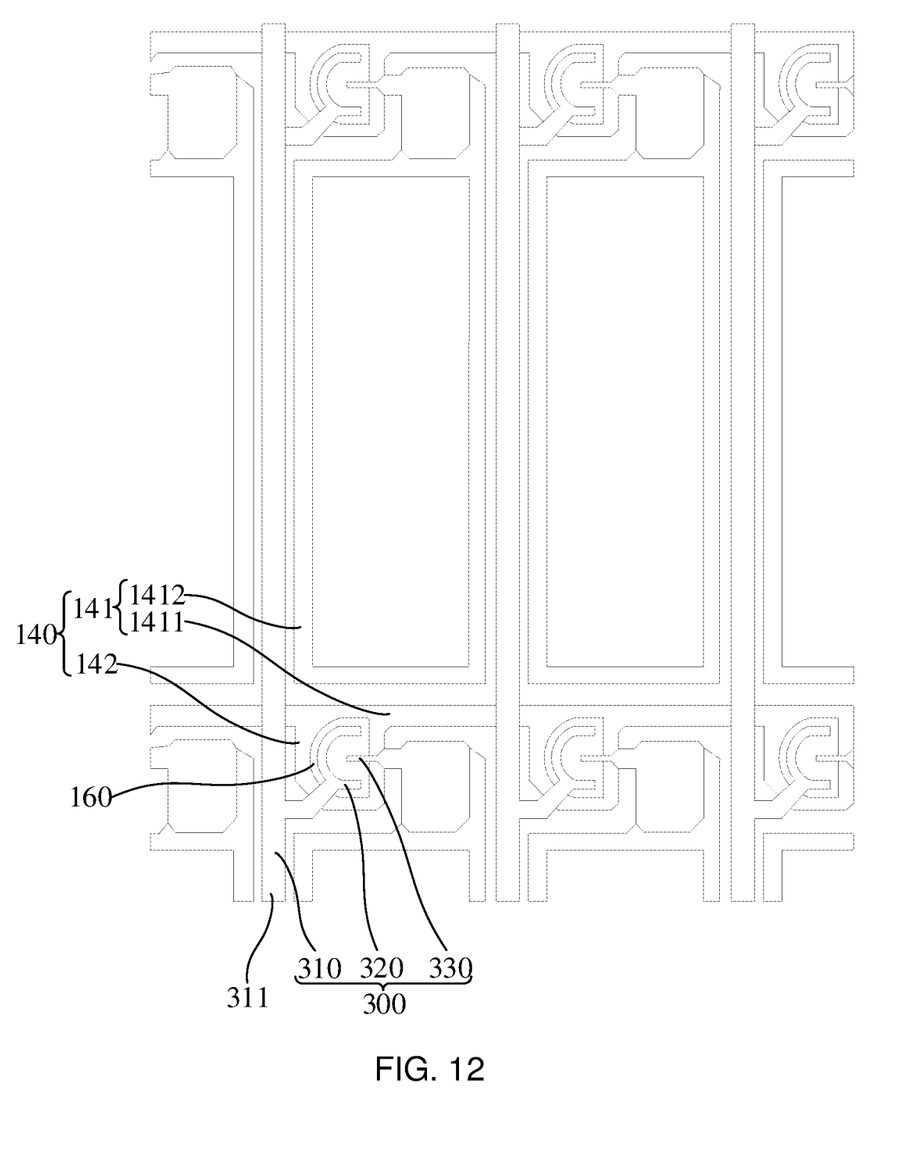
FIG. 12 is a top view of a structural schematic diagram of a TFT substrate according to an embodiment of the present application.

Specifically, as shown in FIG. 11 and FIG. 12, the first metal layer 140 comprises a first signal line 141 and a gate electrode 142, the first signal line 141 is disposed corresponding to the first region 110, and the gate electrode 142 is disposed corresponding to the second region 120. The second metal layer 300 comprises a second signal line 310, a source electrode 320, and a drain electrode 330, the second signal line 310 is disposed corresponding to the first region 110, and the source electrode 320 and the drain electrode 330 are disposed corresponding to the second region 120. In the present embodiment, the first signal line 141 and the second signal line 310 are disposed in parallel. Of course, the first signal line 141 and the second signal line 310 can be interlaced according to the actual situation and specific requirements.

Specifically, as shown FIG. 12, the first signal line 141 comprises a scan line 1411 extending in a first direction and a storage capacitor line 1412 extending in a second direction, the second signal line 310 comprises a data line 311 extending in the second direction, and the first direction and the second direction are set in a present angle. The preset angle can be specified but not limited to 90 degrees.

As shown in FIG. 11 and FIG. 12, the present embodiment further provides a TFT substrate manufactured by the aforementioned method. The TFT substrate has a first region 110, a second region 120, and a third region 130. The TFT substrate comprises a substrate, a first signal line 141, a gate electrode 142, an insulating layer 150, a semiconductor layer 160, a source electrode 320, a drain electrode 330, and a second signal line 310. The first signal line 141 is disposed on the substrate and corresponding to the first region 110. The gate electrode 142 is disposed on the substrate and corresponding to the second region 120. The insulating layer 150 is disposed on the substrate, the gate electrode 142, and the first signal line 141, and corresponding to the first region 110, the second region 120, and the third region 130. The semiconductor layer 160 is disposed on the insulating layer and corresponding to the second region 120. The source electrode 320 and the drain electrode 330 are disposed on the semiconductor layer 160 and corresponding to the second region 120. The second signal line 310 is disposed on the insulating layer 150 and corresponding to the first region 110. The thickness of the insulating layer 150 in the first region 110 is greater than the thickness of the insulating layer 150 in the third region 130. Since the TFT substrate of the present embodiment adopts all the technical solutions of the above embodiments, it also has all the beneficial effects brought by the technical solutions of the above embodiments, which will not be repeated herein.

A method for manufacturing TFT substrate and a TFT substrate thereof provided by the embodiments of the present application are introduced in detail above. Specific exemplary embodiments are used to explain the principle and implementation of the present application in the disclosure. However, the above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. A method for manufacturing thin-film transistor (TFT) substrate, comprising:

step B1: forming a photoresist layer on a semi-finished substrate, wherein the semi-finished substrate comprises a first metal layer, an insulating layer disposed on the first metal layer, and a semiconductor layer disposed on the insulating layer, the photoresist layer is disposed on the semiconductor layer, and the semi-finished substrate has a first region, a second region, and a third region;

step B2: patterning the photoresist layer to expose the semiconductor layer in the third region, where a remaining portion of the photoresist forms a first etching barrier layer corresponding to the first region and where another remaining portion of the photoresist forms a second etching barrier layer corresponding to the second region, wherein a thickness of the first etching barrier layer is less than a thickness of the second etching barrier layer;

step B3: etching the semiconductor layer in the third region under the shielding of the first etching barrier layer and the second etching barrier layer;

step B4: peeling off the first etching barrier layer to expose the semiconductor layer in the first region;

Step B5: etching the semiconductor layer and the insulating layer under the shielding of the second etching barrier layer to remove the semiconductor layer disposed corresponding to the first region, such that a thickness of the insulating layer in the third region is less than a thickness of the insulating layer in the first region.

2. The method for manufacturing TFT substrate as claimed in claim 1, wherein the step of patterning the photoresist layer in the step B2 comprises: performing a photolithography process to the photoresist layer under the shielding of a mask.

3. The method for manufacturing TFT substrate as claimed in claim 2, wherein the photolithography process is performed by using ultraviolet light in the step B2.

4. The method for manufacturing TFT substrate as claimed in claim 3, wherein the exposure volume of the photoresist layer ranges from 35 mJ to 45 mJ.

5. The method for manufacturing TFT substrate as claimed in claim 2, wherein the material of the photoresist layer is a positive photoresist, the mask comprises a first pattern region disposed corresponding to the first region, a second pattern region disposed corresponding to the second region, and a third pattern region disposed corresponding to the third region, the transmittance of the first pattern region is greater than the transmittance of the second pattern region, and the transmittance of the first pattern region is less than the transmittance of the third pattern region.

6. The method for manufacturing TFT substrate as claimed in claim 5, wherein the transmittance of the first pattern region is 40% to 50%, the transmittance of the second pattern region is 0% to 10%, and the transmittance of the third pattern region is 90% to 100%.

7. The method for manufacturing TFT substrate as claimed in claim 2, wherein the material of the photoresist layer is a negative photoresist, the mask comprises a first pattern region disposed corresponding to the first region, a second pattern region disposed corresponding to the second region, and a third pattern region disposed corresponding to the third region, the transmittance of the first pattern region is less than the transmittance of the second pattern region, and the transmittance of the first pattern region is greater than the transmittance of the third pattern region.

8. The method for manufacturing TFT substrate as claimed in claim 7, wherein the transmittance of the first pattern region is 50% to 60%, the transmittance of the second pattern region is 90% to 100%, and the transmittance of the third pattern region is 0% to 10%.

9. The method for manufacturing TFT substrate as claimed in claim 1, wherein the thickness of the first etching barrier layer is 20% to 35% of the thickness of the second etching barrier layer in the step B2.

10. The method for manufacturing TFT substrate as claimed in claim 1, wherein the thickness of the first etching barrier layer obtained in the step B2 is 4000Å to 6000Å, and the thickness of the second etching barrier layer obtained in the step B2 is 15000Å to 20000Å.

11. The method for manufacturing TFT substrate as claimed in claim 1, wherein in the step B3, the semiconductor layer in the third region is etched by dry etching under the shielding of the first etching barrier layer and the second etching barrier layer.

12. The method for manufacturing TFT substrate as claimed in claim 1, wherein the semiconductor layer of the third region is partially or completely etched away.

13. The method for manufacturing TFT substrate as claimed in claim 1, wherein the step of peeling off the first etching barrier layer to expose the semiconductor layer in the first region in the step B4 comprises: ashing the first etching barrier layer and the second etching barrier layer to remove the first etching barrier layer and reduce the thickness of the second etching barrier layer.

14. The method for manufacturing TFT substrate as claimed in claim 1, wherein the semiconductor layer and the insulating layer are etched by dry etching under the shielding of the second etching barrier layer in the step B5.

15. The method for manufacturing TFT substrate as claimed in claim 1, wherein the first metal layer comprises a first signal line and a gate electrode, the first signal line is disposed corresponding to the first region, and the gate electrode is disposed corresponding to the second region.

16. The method for manufacturing TFT substrate as claimed in claim 15, further comprising:
    step B6: peeling off the second etching barrier layer to expose the semiconductor layer in the second region.

17. The method for manufacturing TFT substrate as claimed in claim 16, further comprising:
    step B7: forming a second metal layer on the insulating layer and the semiconductor layer.

18. The method for manufacturing TFT substrate as claimed in claim 17, wherein in the step B7, the second metal layer comprises a second signal line, a source electrode, and a drain electrode, the second signal line is disposed corresponding to the first region, and the source electrode and the drain electrode are disposed corresponding to the second region.

19. The method for manufacturing TFT substrate as claimed in claim 18, wherein the first signal line comprises a scan line extending in a first direction and a storage capacitor line extending in a second direction, the second signal line comprises a data line extending in the second direction, and the first direction and the second direction are set in a present angle.

\* \* \* \* \*